(12) United States Patent
Wang et al.

(10) Patent No.: US 9,043,620 B2
(45) Date of Patent: May 26, 2015

(54) RESOLUTION PROGRAMMABLE DYNAMIC IR-DROP SENSOR WITH PEAK IR-DROP TRACKING ABILITIES

(71) Applicants: Xiaoxiao Wang, Austin, TX (US); Nisar Ahmed, Bee Cave, TX (US); Anis M. Jarrar, Austin, TX (US); Dat T. Tran, Round Rock, TX (US); Leroy Winemberg, Austin, TX (US)

(72) Inventors: Xiaoxiao Wang, Austin, TX (US); Nisar Ahmed, Bee Cave, TX (US); Anis M. Jarrar, Austin, TX (US); Dat T. Tran, Round Rock, TX (US); Leroy Winemberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 259 days.

(21) Appl. No.: 13/798,715

(22) Filed: Mar. 13, 2013

(65) Prior Publication Data

US 2014/0281642 A1 Sep. 18, 2014

(51) Int. Cl.
*G06F 1/26* (2006.01)
*G01R 19/165* (2006.01)
*G01R 31/319* (2006.01)

(52) U.S. Cl.
CPC ............ *G06F 1/26* (2013.01); *G01R 19/16552* (2013.01); *G01R 31/31924* (2013.01)

(58) Field of Classification Search
CPC ................... G01R 19/16552; G01R 31/31924; G06F 1/26

USPC ........................... 324/76.11; 702/64; 713/340
See application file for complete search history.

(56) References Cited

U.S. PATENT DOCUMENTS

| 7,895,454 | B2 | 2/2011 | Singh |
| 8,054,045 | B2 | 11/2011 | Kawahara et al. |
| 2011/0246110 | A1 | 10/2011 | Veendrickk et al. |
| 2012/0126781 | A1* | 5/2012 | Narayanan et al. ......... 324/76.11 |
| 2013/0127441 | A1* | 5/2013 | Tseng et al. ............... 324/76.11 |

OTHER PUBLICATIONS

Abuhamdeh, Z., et al., "A Production IR-Drop Screen on a Chip", IEEE Design & Test of Computers, vol. 24, Issue 3, pp. 216-224, May-Jun. 2007.
Franch, R., et al., "On-chip Timing Uncertainty Measurements on IBM Microprocessors", IEEE International Test Conference 2007, pp. 1-7.

* cited by examiner

*Primary Examiner* — Albert Wang (57) ABSTRACT

A data processing system on an integrated circuit includes a core that performs switching operations responsive to a system clock that draws current from the power supply network. An IR-drop detector includes a resistor ladder having outputs representative of an IR-drop caused by the core during the switching operations. The system further includes a plurality of amplifiers coupled to the outputs indicative of the IR-drop, a plurality of flip-flops coupled to the amplifiers, and a variable clock generator. The variable clock generator outputs a sampling clock comprising a group consisting of a variable phase or a variable frequency to the plurality of flip-flops. The flip-flops are triggered by the sampling clock so that the IR-drop at a time during a clock cycle of the system clock can be detected, and the peak IR-drop value for can be tracked.

20 Claims, 5 Drawing Sheets

RESOLUTION PROGRAMMABLE DYNAMIC IR-DROP SENSOR WITH PEAK IR-DROP TRACKING ABILITIES

BACKGROUND

1. Field

This disclosure relates generally to semiconductor devices, and more specifically, to a sensor device for dynamically measuring IR-drop in a voltage supply.

2. Related Art

As the size of semiconductor circuit components such as transistors decreases, the level of supply voltage to operate the components also decreases. At the same time, the capabilities and functional features of electronic devices are becoming more complex and numerous, requiring the supply voltage to be distributed among an ever-increasing number of components. One or more functions of a circuit may not perform as desired if the expected level of supply voltage is not provided to the circuit due to the voltage drop along power networks. For example, CMOS transistors with gates that are 55 nanometer long can be subject to a 250 to 300 milliVolts current-resistance drop (IR-drop) when a large number of the transistors switch at the same time, whether during test or during normal operation. In some cases, it is desirable to be able to identify whether a circuit's performance failure has been caused by IR-drop in the voltage supplied network of the circuit.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods for sensing IR-drop in supply voltage being provided to one or more processing devices are disclosed. As the size of electronic components becomes smaller and the number of devices more numerous, the ability to measure IR-drop dynamically and accurately can help pinpoint whether a supply voltage to a circuit is inadequate, as well as help identify areas in a design that may be changed to help prevent performance failures due to momentary variation in supply voltage. Embodiments of IR-drop sensors disclosed herein measure various levels of IR-drop voltage level quickly and accurately. The frequency of a sampling clock signal in the IR-drop sensor can be adjusted to track IR-drop peak or record a waveform that includes a complete cycle of variation of supply voltage due to IR-drop. The IR-drop data can be used to improve decoupling strategy for circuit elements, reduce or redistribute transistor switching during automated test pattern generation (ATPG) test scan patterns.

Figure 1:
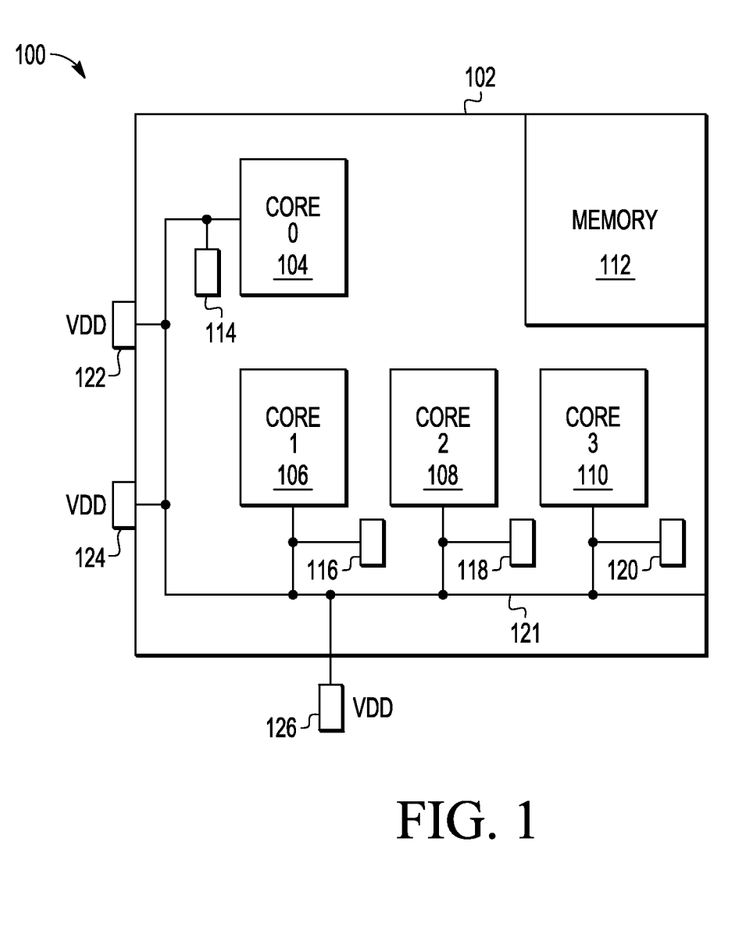
FIG. 1 is a block diagram of an embodiment of a computer processing system in accordance with the present invention.

FIG. 1 is a block diagram of an embodiment of a computer processing system 100 in accordance with the present invention that includes a semiconductor die 102 on which a layer of electronic devices is formed. System 100 can be referred to as a system on a chip, for example. Two or more layers of metal separated by insulating or dielectric layers can be formed over the layer of electronic devices. The layer of electronic devices can include one or more processing cores 104, 106, 108, 110, one or more memory devices 112, and one or more IR-drop sensors 114, 116, 118, 120 formed using one or more semiconductor processing technologies. In the embodiment shown, each IR-drop sensor 114-120 is coupled to a corresponding one of processing cores 104-110.

A power network or line 121 is provided in a metal layer referred to as a power net and routed through one or more of the intermediate metal and insulating layers to provide supply voltage VDD to processing cores 104-110, memory 112, and IR-drop sensors 114-120. An external supply voltage VDD can be connected to one or more contact pads 122, 124, 126 formed on an external edge of semiconductor die 102 and routed to power buss 121. IR-drop sensors 114-120 can also be coupled to a voltage for which IR-drop will be measured for a corresponding core 104-110

Processing cores 104-110 and IR-drop sensors 114-120 can be any suitable processing devices that execute logic functions in hardware, software, or a combination of hardware and software to perform desired tasks. Cores 104-110 and IR-drop sensors 114-120 can be coupled to communicate with memory 112. Cores 104-110 can also be coupled to communicate with one another.

Memory device 112 can be any suitable type or combination of types of volatile and/or non-volatile memory for storing data such as SRAM, DRAM, flash, MRAM, EEPROM, SDRAM, and PRAM (Phase change RAM).

Figure 2:
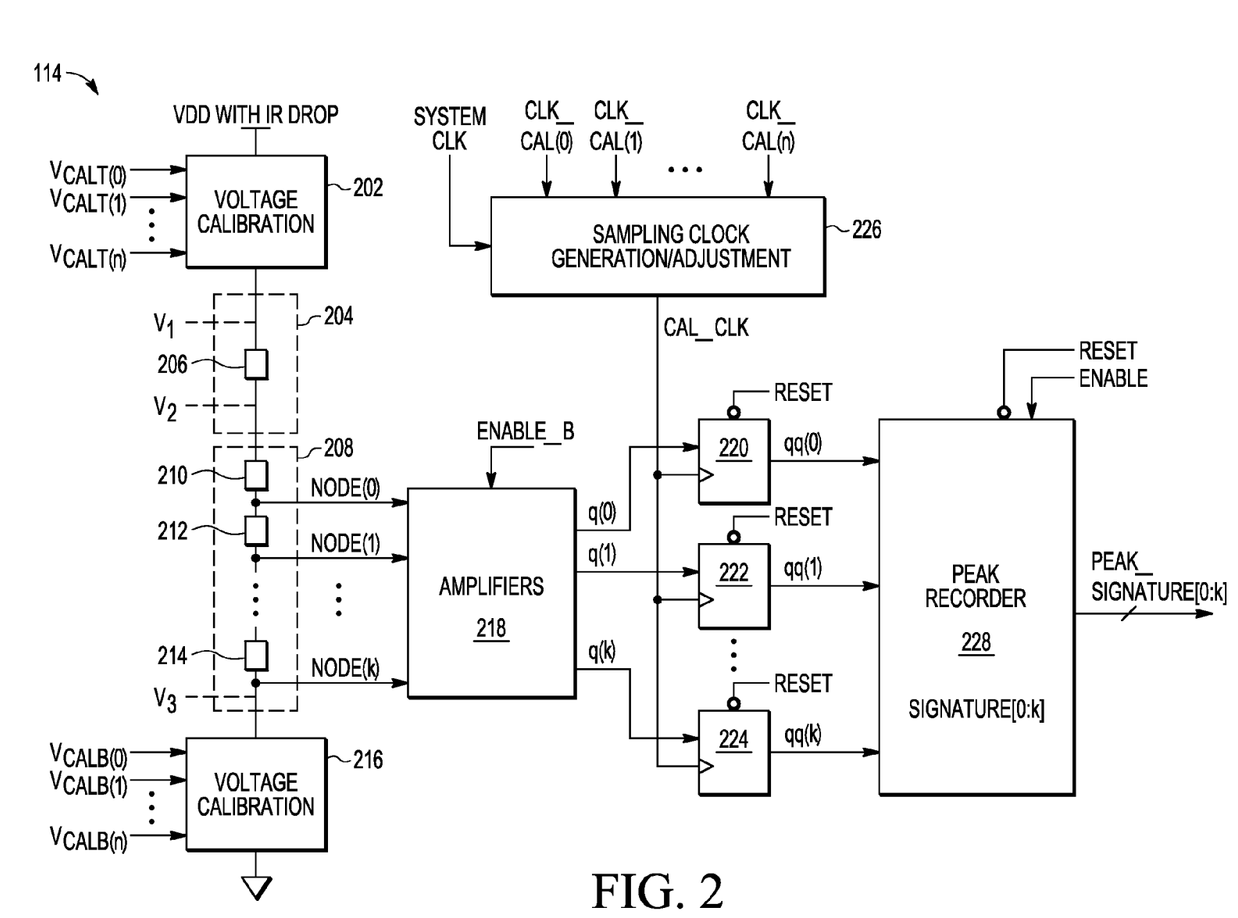
FIG. 2 is a block diagram of an embodiment of an IR-drop sensor that may be used in the processing system of FIG. 1.

FIG. 2 is a block diagram of an embodiment of an IR-drop sensor 114 that may be used in the processing system 100 of FIG. 1 including top voltage calibration circuit 202, a first resistor ladder 204 having resistor 206 coupled in series with a second resistor ladder 208 having resistors 210, 121, 214, and bottom voltage calibration circuit 216 coupled to an end of resistor ladder 208. Resistors 208-214 are coupled in series. Different voltage levels V1, V2 and V3 are available at different levels of resistor ladders 204/206. For example, V1 is available between an output terminal of voltage calibration circuit 202 and an input terminal of resistor 206. V2 is available between an output terminal of resistor 206 and an input terminal of resistor 210. V3 (also shown as NODE(k) voltage) is available between an output terminal of resistor 214 and an input terminal of voltage calibration circuit 216. Additional intermediate values of voltage, shown as NODE(0) and NODE(1) are available between respective resistors 210-212 and 212-214. Voltage levels V2 and V3 set a range of voltage over which IR-drop can be measured.

A series of voltages NODE(0), NODE(1), through NODE(k) are provided to a corresponding set of amplifier circuits 218. Amplifier circuits 218 output digital values q(0) through q(k) indicating whether corresponding input voltages NODE(0), NODE(1), through NODE(k) reached a particular level. Each amplifier output signal q(0) through q(k) is provided as a first input to a corresponding flip-flop circuit 220, 222 through 224. A calibrated clock signal (CAL_CLK) is provided by sampling clock generation/adjustment circuit 226 as a second input to flip-flop circuits 220, 222 through 224.

In the embodiment shown, the input supply voltage VDD signal with IR-drop is an analog signal and the output of amplifiers 218, flip-flops 220-224, and peak recorder 228 are digital signals. Flip-flop circuits 220-224 latch the input signals q(0) through q(k) during each calibrated clock cycle. A flip-flop circuit will be set "high" if the input signal reaches a predetermined voltage threshold. Otherwise, if the input signal to the flip-flop circuit does not reach the threshold voltage, the output of the flip-flop will be "low". A signature signal (SIGNATURE[1:k]) is aggregated by peak recorder 228 and is comprised of the output signals qq(0) through qq(k) of respective flip-flop circuits 220-224. Peak recorder 228 outputs a PEAK_SIGNATURE[0:k] signal that is set to the signature signal with the peak IR-drop sensed in the supply voltage VDD with IR-drop signal that is input to voltage calibration circuit 202 over measurement clock cycles.

A series of VDD with IR-drop SIGNATURE[0:k] can be generated by peak recorder 228 and stored in memory 112. In some embodiments, the signatures can be a series of bits corresponding to the output signals qq(0)-qq(k) of flip-flops 220-224. For example, a first signature[0:7] may be [00001111] and a second signature[0:7] may be [00111111]. The lower number of bits set to "1" in the first signature[0:7] indicates a higher IR-drop compared to the second signature [0:7]. The signature with the lowest number of bits set to "1" can be selected as the peak IR-drop signature[0:k] by peak recorder 228. Some or all the logic executed by peak recorder 228 can be implemented in hardware and/or a software programming language such as RTL (register transfer language) or other suitable programming language.

An ENABLE signal can be provided to peak recorder circuit 228 and a complement of the ENABLE signal (ENABLE_B) can be provided to amplifiers 218 to turn on the amplifier circuit. The ENABLE signal is set to enable operation of IR-drop sensor 114 during calibration of NODE(0) through NODE(k) voltages and the calibration clock signal (CAL_CLK), as well as during measurement f the IR-drop. After the IR-drop is measured, the ENABLE signal can be set to disable operation of IR-drop sensor 114. While the ENABLE signal is set to disable operation of IR-drop sensor 114, a reset signal (RESET) can be set to reset flip-flop circuits 220-224 and peak recorder 228. The reset signal can be inverted at the input to flip-flop circuits 220-224 and peak recorder 228 depending on the logic implementation being used.

Inputs to top voltage calibration circuit 202 can include the voltage for which IR-drop will be measured and a plurality of top voltage selection indicators VCALT(0), VCALT(1) through VCALT(n) that are used to select a top or high voltage output V1 from voltage calibration circuit 202 that is provided to resistor ladder 204. For example, top voltage selection indicators VCALT(0), VCALT(1) through VCALT(n) can be implemented as bits in a digital word in which one of the bits is set to indicate the starting level of the top voltage V1. The top voltage selection indicators VCALT(0), VCALT(1) through VCALT(n) can be provided by a calibration controller (not shown) that is implemented as part of IR-drop sensor 114. The calibration controller can initially select a bit in the VCALT(0)-(n) inputs for a mid-range value, or a high or low value of voltage for V1.

Similarly, inputs to voltage calibration circuit 216 can include a plurality of bottom voltage selection indicators VCALB(0), VCALB(1) through VCALB(n) that are used to set a bottom or low voltage V3 at voltage calibration circuit 216. For example, bottom voltage selection indicators VCALB(0), VCALB(1) through VCALB(n) can be implemented as bits in digital?? word in which one of the bits is set to indicate the starting level of the bottom voltage V3. The bottom voltage selection indicators VCALB(0), VCALB(1) through VCALB(n) can be provided by the calibration controller (not shown) that is implemented as part of IR-drop sensor 114. The calibration controller can initially select a bit in the VCALB(0)-(n) inputs for a mid-range value, or a top or bottom value of voltage for V3. Note that the circuit topology similar to the circuit topology used for bottom calibration circuit 216 can also be used for top voltage calibration circuit 202 instead of the embodiment of circuit 202 shown in FIG. 3.

The difference between top voltage V1 and bottom voltage V3 sets a voltage range over which IR-drop in a supply voltage VDD is measured. In determining the values for top voltage V1 and bottom voltage V3, a speculative value for V1 and V3 can be set by top voltage calibration circuit 202 and bottom calibration circuit 216 and then a measurement of IR-drop taken and recorded using amplifiers 218, flip-flop circuits 220-224, and peak recorder 228. The final values for top voltage V1 and bottom voltage V3 are selected to at least cover the range of voltages expected for the VDD with IR-drop signal that is provided as input to IR-drop sensor 114.

Although the embodiment of IR-drop sensor 114 shown includes two sections of resistor ladder 204, 208, resistor ladder 204 may be left out of other embodiments. In still further embodiments, one or the other of voltage calibration circuits 202, 216 may be eliminated. The number and resistance of resistors in resistor ladder 208 can be selected to provide the granularity desired for detecting the peak IR-drop. The greater the number of transistors 210-214, the greater the granularity due to the higher the number of corresponding amplifiers in amplifier circuits 218 and flip-flop circuits 220-224.

In addition to calibrating voltages V1, V2 and V3, IR-drop sensor 114 can also calibrate the clock signal CAL_CLK that is used by flip-flops 220-224. In some embodiments, sampling clock generation adjustment circuit 226 can adjust the phase of a system clock signal to trigger the CAL_CLK signal when the peak IR-drop occurs in each clock cycle, as further described herein. In other embodiments, an oscillator circuit can be implemented in sampling clock generation adjustment circuit 226 that adjusts the frequency of the CAL_CLK signal to take a minimum number of samples that are sufficient to catch the peak IR-drop over a selected number of cycles, as further described herein.

Figure 3:
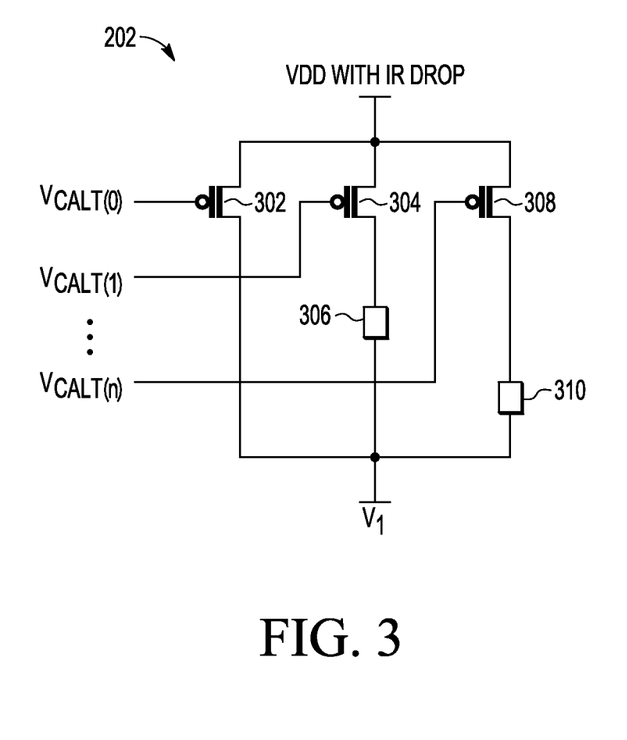
FIG. 3 is a schematic diagram of an embodiment of a voltage calibration circuit that may be used in the IR-drop sensor of FIG. 2.

FIG. 3 is a schematic diagram of an embodiment of top voltage calibration circuit 202 that may be used in the IR-drop sensor 114 of FIG. 2 that includes P-channel transistors 302, 304, 306 coupled in parallel with one another. P-channel transistor 304 is coupled in series with resistor 306 and P-channel transistor 308 is coupled in series with resistor 310. Top voltage calibration circuit 202 may include any suitable number of transistors in series with a corresponding resistor coupled in parallel. A gate terminal of transistor 302 is coupled to VCALT(0). A gate terminal of transistor 304 is coupled to VCALT(1). A gate terminal of transistor 308 is coupled to VCALT(n).

The VCALT(0)-(n) signals are provided by a calibration controller (not shown) and are set to put corresponding P-channel transistors 302-308 in conductive or non-conductive mode based on the highest level of voltage (VDD with IR-drop) expected at the input. For example, VCALT(0) can be set to "0" to place transistor 302 in conducting mode while the remaining VCALT(1)-(n) are set to "1" to place transistors 304, 308 in non-conducting mode. The voltage V1 will be the voltage at the source terminal of transistor 302, that is, the VDD with IR-drop voltage. To raise the voltage to a level desired to detect voltages without IR-drop as well as with IR-drop, one or more of VCALT(1)-(n) can be set to place corresponding transistors in conducting mode to increase voltage V1. The settings for VCALT(0)-(n) can be determined once during calibration and retained through the measurement phase of operation of IR-drop sensor 114.

Figure 4:
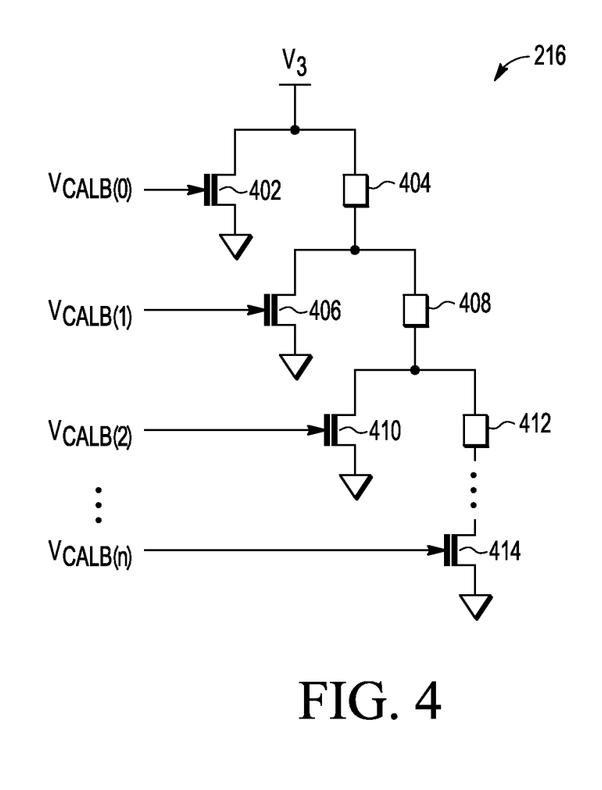
FIG. 4 is a schematic diagram of another embodiment of a voltage calibration circuit that may be used in the IR-drop sensor of FIG. 2.

FIG. 4 is a schematic diagram of another embodiment of bottom voltage calibration circuit 216 that may be used in the IR-drop sensor 114 of FIG. 2 including N-channel transistor 402 with a drain terminal coupled to the VDD with IR-drop signal and a first terminal of resistor 404, a source terminal coupled to ground and a control gate terminal coupled to the VCALB(0) signal.

A second terminal of resistor 404 is coupled together with a drain terminal of N-channel transistor 406 and a first terminal of resistor 408. Transistor 406 further has a source terminal coupled to ground and a control gate terminal coupled to the VCALB(1) signal.

A second terminal of resistor 408 is coupled together with a drain terminal of N-channel transistor 410 and a first terminal of resistor 412. Transistor 410 further has a source terminal coupled to ground and a control gate terminal coupled to a VCALB(2) signal.

A second terminal of resistor 412 is coupled to a source terminal of N-channel transistor 414. N-channel transistor 414 further has a source terminal coupled to ground and a control gate terminal coupled to a VCALB(n) signal.

VCALB(0)-(n) signals can be set by a calibration controller (not shown) to establish low voltage level V3 so that the voltage potential in the difference between V1 and V3 is sufficient to allow the expected levels of the VDD with IR-drop voltage signal to be detected. For example, if VCALB(0) is set to "1", transistor 402 will be in conducting mode and voltage at the source of transistor 402 (or V3) will be at ground level. If one or more of the other VCALB(1)-(n) signals are set to "1", voltage at the source of transistor 402 (or V3) will be at a level higher than ground, depending on the value of resistor 404 and any other of resistors 408-412 that are coupled to one of transistors 406-410 that are in non-conducting mode.

Figure 5:
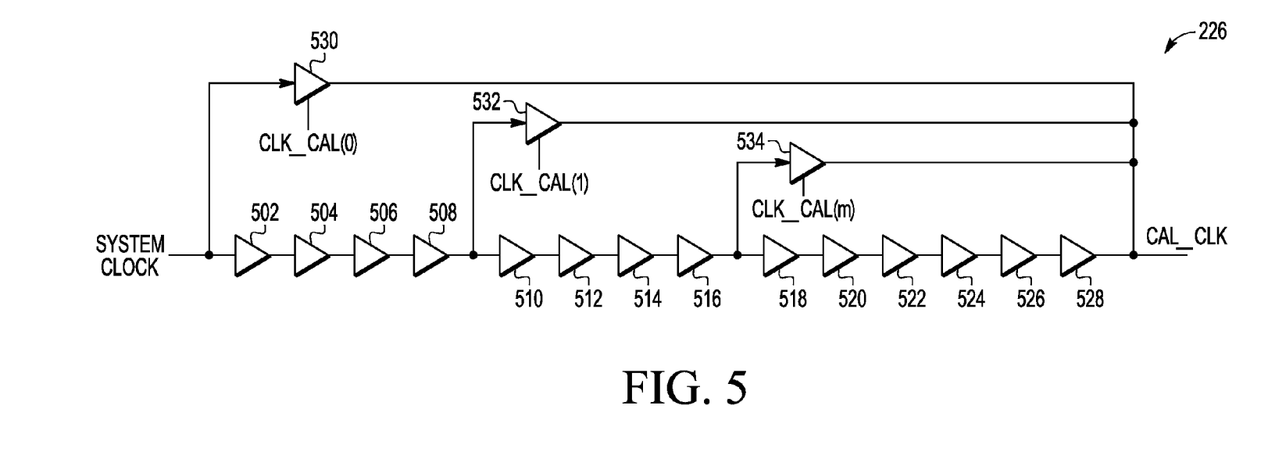
FIG. 5 is a schematic diagram of an embodiment of a sampling clock generation circuit that may be used in the IR-drop sensor of FIG. 2.

FIG. 5 is a schematic diagram of an embodiment of a sampling clock generation circuit 226 that may be used in the IR-drop sensor 114 of FIG. 2 including delay buffers 502, 504, 506, 508, 510, 512, 514, 516, 518, 520, 522, 524, 526, 528 coupled in series. A first tri-state buffer 530 is coupled in parallel with buffers 502-528 between the input to buffer 502 and the output of buffer 528. A second tri-state buffer 532 is coupled in parallel with buffers 510-528 between the input to buffer 510 and the output of buffer 528. A third tri-state buffer 534 is couple in parallel with buffers 518-528 between the input to buffer 518 and the output of buffer 528. A system clock signal is provided at the input of buffer 502 and tri-state buffer 530. The system clock signal may be generated by another component in processing system 100 and provided to other components in system 100.

When tri-state buffers 530-534 are in high-impedance mode (CAL_CLK(0)-(m) control signals are "0", for example), a maximum-available phase delay is introduced in the system clock signal by buffers 502-528 to provide a CAL_CLK signal that is used by flip-flop circuits 220-224 (FIG. 2).

When tri-state buffer 530 is in low-impedance mode (CAL_CLK(0) control signal is "1", for example) and tri-state buffers 532-534 are in high-impedance mode (CAL_CLK(1)-(m) control signals are "0", for example), delay buffers 502-528 are bypassed and little or no phase shift is introduced in the system clock signal. Accordingly, the CAL_CLK signal provided to flip-flops 220-224 is approximately the same as the system clock signal.

When tri-state buffer 532 is in low-impedance mode (CAL_CLK(1) control signal is "1", for example) and tri-state buffers 530 and 534 are in high-impedance mode (CAL_CLK(0) and CAL_CLK(m) control signals are "0", for example), delay buffers 502-508 shift the phase of the system clock signal by a first amount, depending on the delay introduced by each delay buffer 502-508. Accordingly, the phase of the CAL_CLK signal provided to flip-flops 220-224 is shifted by the first amount compared to the system clock signal.

When tri-state buffer 534 is in low-impedance mode (CAL_CLK(m) control signal is "1", for example) and tri-state buffers 530 and 532 are in high-impedance mode (CAL_CLK(0) and CAL_CLK(1) control signals are "0", for example), delay buffers 502-516 shift the phase of the system clock signal by a second amount that is longer than the first amount, depending on the delay introduced by each delay buffer 502-516. Accordingly, the phase of the CAL_CLK signal provided to flip-flops 220-224 is shifted by the second amount compared to the system clock signal.

Additional tri-state buffers such as buffers 530-534 can be coupled in parallel with one or more of buffers 502-528 to attain a desired level of granularity in shifting the phase of the system clock signal. One reason for providing CAL_CLK signal with a phase that can be shifted by various amounts compared to the system clock is to calibrate the start of the CAL_CLK signal to coincide with the peak IR-drop observed during a clock cycle. Thus, during a clock calibration mode, one of tri-state buffers 530-534 can be placed in low-impedance mode depending on the amount of phase shift required for the start of the CAL_CLK signal to coincide with the peak IR-drop in the power supply VDD signal.

Figure 6:
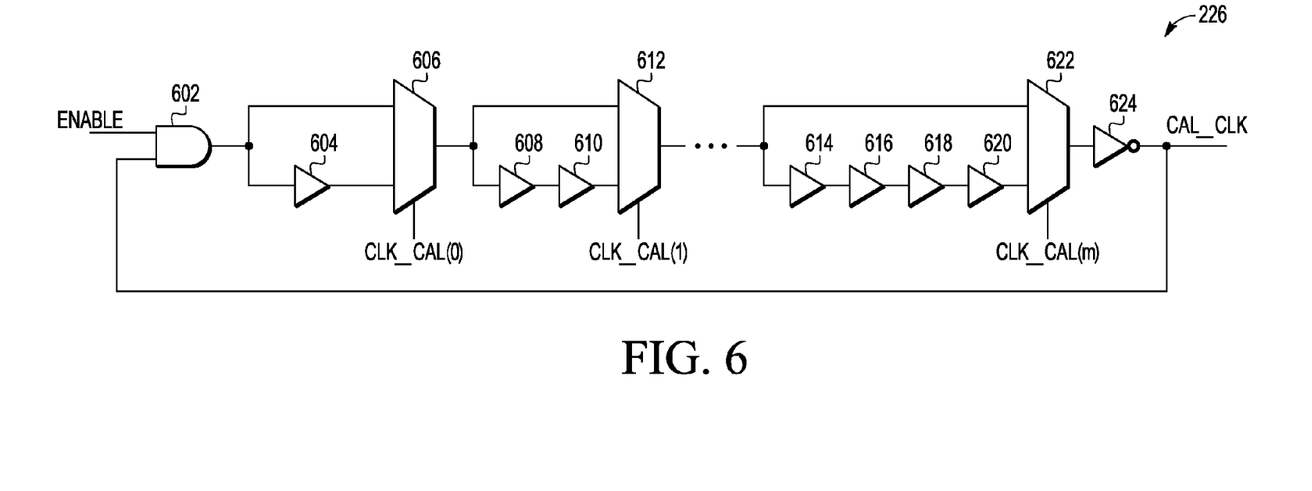
FIG. 6 is a schematic diagram of another embodiment of a sampling clock generation circuit that may be used in the IR-drop sensor of FIG. 2.

FIG. 6 is a schematic diagram of another embodiment of a sampling clock generation circuit 226 that may be used in the IR-drop sensor 114 of FIG. 2 to generate the CAL_CLK signal provided to flip-flops 220-224 (FIG. 2). Sampling clock generation circuit 226 includes AND gate 602 having a first input coupled to an ENABLE signal and a second input coupled to the CAL_CLK signal output by sampling clock generation circuit 226. A first delay stage includes delay buffer 604 coupled between the output of AND gate 602 and a first input of multiplexer 606. A second input of multiplexer 606 is coupled to the output of AND gate 602. A CLK_CAL(0) signal is coupled to select which input of multiplexer 606 is output by multiplexer 606.

A second delay stage includes delay buffers 608, 610 coupled in series between the output of multiplexer 606 and a first input of multiplexer 612. A second input of multiplexer 612 is coupled to the output of multiplexer 606. A CLK_CAL(1) signal is coupled to select which input of multiplexer 612 is output by multiplexer 612.

A third delay stage includes delay buffers 614, 616, 618, 620 coupled in series between the output of multiplexer 612 and a first input of multiplexer 622. A second input of multiplexer 622 is coupled to the output of multiplexer 612. A CLK_CAL(m) signal is coupled to select which input of multiplexer 622 is output by multiplexer 622.

The output of multiplexer 622 can be input to inverter 624 to generate the CAL_CLK signal that is used by flip-flops 220-224 (FIG. 2).

Additional delay stages with a suitable number of delay buffers coupled in series to a multiplexer with an output selection input CLK_CAL(m) can be included in sampling clock generation circuit 226.

One or more of CAL_CLK(0)-(m) signals can be set to lower the frequency of the CAL_CLK signal compared to a CAL_CLK signal that is generated without using delay buffers 604, 608, 610, and/or 614-620.

When the ENABLE signal is set to "1" and the CAL_CLK signal is "0", the input to inverter 624 will be "0" whether or not any delay is introduced by delay buffers 604, 608, 610, and/or 614-620. The CAL_CLK signal output by inverter 624 will be "1" and is fed back to AND gate 602. If the ENABLE signal is still set to "1", the output of AND gate 602 will be "1" and will propagate to the input of inverter 624 as "1". The output of inverter 6254 will be "0" and fed back to AND gate 602. The CAL_CLK signal will thus switch from "1" to "0" or from "0" to "1" each cycle through sampling clock generation circuit 226. The speed at which the output of the AND gate 602 reaches the input of inverter 624 can be controlled by setting one or more of CLK_CAL(0)-(m) signals so that respective multiplexers 606, 612, 622 output the delayed signal so the desired frequency of the CAL_CLK signal is attained.

With reference to FIG. 2, the phase (by the embodiment of sampling clock generation circuit 226 in FIG. 5) or frequency (by the embodiment of sampling clock generation circuit 226 in FIG. 6) of the CAL_CLK signal may be selected so that the peak IR-drop value is detected over a period of time with the number of samples available. For example, the VDD with IR-drop voltage may be samples five to ten times per measurement cycle. The length of time the ENABLE signal is set determines the length of the measurement cycle.

Figure 7:
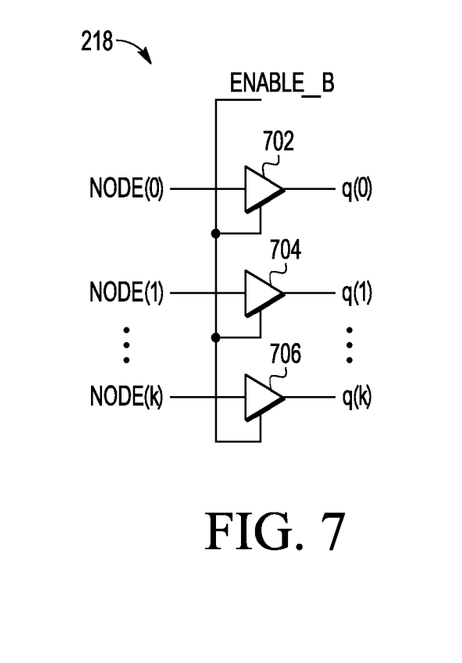
FIG. 7 is a schematic diagram of an embodiment of an amplifier circuit that may be used in the IR-drop sensor of FIG. 2.

FIG. 7 is a schematic diagram of an embodiment of an amplifier circuit 218 that may be used in the IR-drop sensor 114 of FIG. 2 including a number of amplifiers 702, 704, 706 each having an input coupled to a respective node voltage (NODE(0)-NODE(k)) from resistor ladder 208 and an output signal (q(0)-q(k)). A control input to each amplifier 702, 704, 706 is coupled to the complement of the ENABLE signal from a calibration controller (not shown). The ENABLE signal is also used by the peak recorder circuit 228, as shown in FIG. 2.

Figure 8:
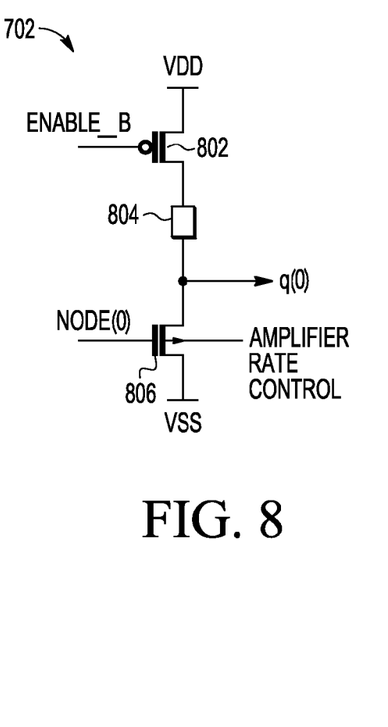
FIG. 8 is a schematic diagram of an embodiment of an amplifier that may be used in the amplifier circuit of FIG. 7.

FIG. 8 is a schematic diagram of an example embodiment of an amplifier 702 that may be used in the amplifier circuit 218 of FIG. 7 including a resistor 804 coupled between a P-channel transistor 802 and an N-channel transistor 806. The complement of the ENABLE signal is coupled to a gate terminal of P-channel transistor 802. A source electrode of the P-channel transistor 802 is coupled to a supply voltage, such as VDD and a drain electrode of the P-channel transistor 802 is coupled to a first terminal of resistor 804. N-channel transistor 806 has a drain electrode coupled to a second terminal of resistor 804, a gate terminal coupled to the NODE(0) signal from resistor ladder 208 (FIG. 2), and a source terminal coupled to ground or a supply voltage VSS that is lower than VDD. A control input to vary gate voltage and change the amplifier rate control can optionally be coupled to the gate electrode of N-channel transistor 806 through the body of N-channel transistor 806. The output signal Q(0) of amplifier 702 is coupled between the second terminal of resistor 804 and the drain electrode of N-channel transistor 806.

In other embodiments, amplifier 702 can be implemented with an inverter that includes a P-channel transistor coupled in series with an N-channel transistor, and the gate electrodes of both the P and N-channel transistors coupled to a corresponding one of the NODE signals from resistor ladder 208 (FIG. 2).

When the ENABLE_B signal is low, P-channel transistor 802 is in conductive mode. When the NODE(0) signal is high (above threshold voltage of transistor 806), the N-channel transistor 806 is in conductive mode. When transistors 802 and 806 are both in conductive mode, the amplifier output signal q(0) will be "0" due to the pull-down effect of transistor 806. The amplifier output signal q(0) will be "1" when transistor 802 is in conductive mode and transistor 806 is in non-conductive mode. The amplifier output signal q(0) will be "0" when transistor 802 is in non-conducting mode and transistor 806 is in non-conductive mode. When the sensor is not used and the ENABLE signal is "0" (ENABLE_B is "1") all the VCALB(0)-(n) signals will be "0". So the voltages of V3, and Node(x) in FIG. 2 will be higher than the threshold voltage of the N-channel transistor 806 in FIG. 8, so q(0) of FIG. 8 will be "0".

Figure 9:
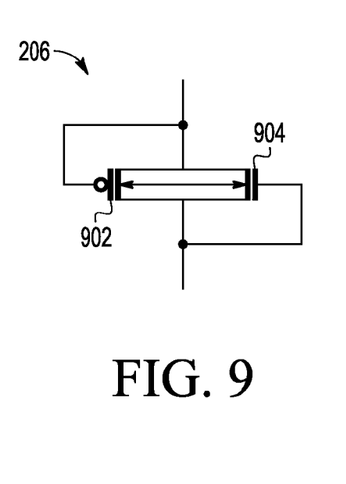
FIG. 9 is a schematic diagram of an embodiment of a resistor constructed by transistors that may be used in the IR-drop sensor of FIG. 2.

FIG. 9 is a schematic diagram of an embodiment of a resistor 900 that may be used instead of polysilicon resistors 206, 210-214 in the IR-drop sensor 114 of FIG. 2 that includes a P-channel transistor 902 and an N-channel transistor 904 with the source electrode of transistor 902 coupled to the drain electrode of transistor 904 and the drain electrode of transistor 902 coupled to the source electrode of transistor 904. A gate electrode of transistor 902 is coupled the source electrode of transistor 902 and the drain electrode of transistor 904. A gate electrode of transistor 904 is coupled the source electrode of transistor 904 and the drain electrode of transistor 902. The length and width of the gate electrode of resistor 900 determine the resistance value of resistor 900. One or more of resistor 900 can also be used to implement bottom voltage calibration circuit 216 (FIG. 2) with the control gate of transistor 904 being coupled to a control signal to enable and disable the resistance.

By now it should be appreciated that there has been provided an IR-drop sensor 114 (FIG. 1) that can be used with a system on a chip or other processing system to determine the IR-drop in a supply voltage during various phases of operation, such as power-up test, where multiple circuit elements such as transistors are being switched simultaneously. The heavy load and resulting IR-drop due to simultaneous switching may cause the processing system to fail during test modes or even during normal operation if a substantial number of circuit elements are switching. The ability to record the peak IR-drop can be used to pinpoint the cause of failures, such as whether there is a fault with the power supply or whether the problem really does lie in the design of the processing system. The ability to predict IR-drop can also be used to develop more robust designs that tolerate a certain level of IR-drop in the supply voltage. Notably, the embodiments of IR-drop sensor 114 disclosed herein use gate threshold voltage in flip-flops 220-224 (FIG. 2) to measure IR-drop and therefore do not require a voltage reference signal. Additionally, IR-drop sensor 114 can perform multiple measurements in one clock cycle, thereby producing results more quickly than known IR-drop sensors.

In some embodiments, a data processing system (100) on an integrated circuit includes a core (104) that performs switching operations responsive to a system clock that draws current from the power supply network (114). The system further includes an IR-drop detector (FIG. 2) that includes a resistor ladder (204, 208) having a plurality of outputs representative of an IR-drop caused by the core during the switching operations. The system further includes a plurality of amplifiers (218) coupled to the outputs indicative of the IR-drop, a plurality of flip-flops (220, 222, 224) coupled to the amplifiers, and a variable clock generator (226). The variable clock generator outputs a sampling clock (cal-clk) comprising a first feature of a group consisting of a variable phase or a variable frequency to the plurality of flip-flops, wherein the plurality of flip-flops are triggered by the sampling clock so that the IR-drop at a time during a clock cycle of the system clock can be detected.

In another aspect of the data processing system, the IR-drop detector can further comprise a first voltage calibration circuit (202) coupled between the first terminal of the resistor ladder and the power supply network.

In another aspect of the data processing system, the plurality of amplifiers can be characterized as having a threshold voltage and a configurable resolution. The first voltage calibration circuit can be variable to optimize a location of a voltage range of the resistor ladder relative to the threshold voltage.

In another aspect of the data processing system, a second calibration circuit (216) can be coupled between the second terminal of the resistor ladder and a ground terminal.

In another aspect of the data processing system, the first voltage calibration circuit can comprise a plurality of loads (306, 310) can be selectively coupled in parallel.

In another aspect of the data processing system, the second calibration circuit can comprise a plurality of loads (404, 408, 412) selectively coupled in series.

In another aspect of the data processing system, the first feature is the variable frequency and the variable frequency is greater than a frequency of the system clock.

In another aspect of the data processing system, a second feature can comprise the variable phase.

In another aspect of the data processing system, the plurality of amplifiers can comprise a first amplifier that can include an N channel transistor (806) having a gate coupled to a first output of the plurality of outputs, a source coupled to a ground terminal, and a drain, and a P channel transistor (802) having a gate coupled to the first output of the plurality of outputs, a source connected to the power supply network, and a drain coupled to the drain of the N channel transistor.

In another aspect of the data processing system, the variable clock generator can be responsive to the system clock.

In another embodiment, a data processing system on an integrated circuit, can comprise a core (104), coupled to a first power supply network (VDD), that performs switching operations responsive to a system clock that cause an IR-drop from the first power supply network. An IR-drop detector (FIG. 2) can include a first voltage calibration (202) circuit having a first terminal coupled to the first power supply network and a second terminal. A resistor ladder (204, 208) can have a first terminal coupled to the second terminal of the first voltage and a second terminal. The resistor ladder can have a plurality of outputs between the first terminal and the second terminal of the resistor ladder. A first plurality of voltage sensors (218, 220, 222, 224) can be coupled to the outputs of the resistor ladder. The outputs of the resistor ladder can be representative of the IR-drop. Each voltage sensor of the plurality of voltage sensors can have a first threshold voltage. The first voltage calibration circuit can be variable to optimize a location of a voltage range of the resistor ladder relative to the first threshold voltage.

In another aspect of the data processing system, each of the plurality of voltage sensors can have a first threshold voltage. When the IR-drop is increased, fewer inputs of the plurality of sensors exceed the first threshold voltage.

In another aspect of the data processing system, a variable clock generator (226) can provide a sampling clock coupled to the plurality of voltage sensors.

In another aspect of the data processing system, the variable clock generator can vary the frequency and phase of the sampling clock.

In another aspect of the data processing system, the plurality of voltage sensors can indicate the IR-drop at a plurality of locations within a period of the system clock.

In still other embodiments, a method for operating a data processing system (100) can have a core (104) coupled to a first power supply network. The core can be operated to cause an IR-drop at the first power supply network responsive to a first clock having a phase and a frequency. A resistor ladder (204, 208) can be used to generate a plurality of outputs representative of the IR-drop. The plurality of outputs can be received with a plurality of flip-flops (220, 222, 224) clocked with a second clock having a phase and a sampling frequency. An output indicative of the IR-drop can be provided from the plurality of flip-flops responsive to the second clock.

In another aspect of the method, the step of providing the output indicative of the IR-drop can be further characterized by the second clock having a different phase from the first clock.

In another aspect of the method, the providing the output indicative of the IR-drop can be further characterized by the second clock having a different frequency from the first clock.

In another aspect of the method, the providing the output indicative of the IR-drop can provide the output indicative of the IR-drop at the frequency of the second clock.

In another aspect of the method, the first clock can have a time period between first edges of the first clock. The step of providing the output indicative of the IR-drop can be further characterized by the output indicative of the IR-drop being provided for a selectable time within the time period between the first edges.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, system 100 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A data processing system on an integrated circuit, comprising:
    a core, coupled to a power supply network that performs switching operations responsive to a system clock that draws current from the power supply network; and
    an IR-drop detector, comprising:
        a resistor ladder, coupled to the power supply network, having a plurality of outputs representative of an IR-drop caused by the core during the switching operations;
        a plurality of amplifiers, coupled to the plurality of outputs;
        a plurality of flip-flops coupled to the plurality of outputs of the plurality of amplifiers; and
        a variable clock generator that outputs a sampling clock comprising a first feature of a group consisting of a variable phase or a variable frequency to the plurality of flip-flops, wherein the plurality of flip-flops are triggered by the sampling clock so that the IR-drop at a sampling time can be detected.

2. The data processing system of claim 1, wherein the IR-drop detector further comprises:
    a first voltage calibration circuit coupled between the first terminal of the resistor ladder and the power supply network.

3. The data processing system of claim 2, wherein:
    the plurality of amplifiers is characterized as having a threshold voltage and a configurable resolution; and the first voltage calibration circuit is variable to optimize a location of a voltage range of the resistor ladder relative to the threshold voltage.

4. The data processing system of claim 3, further comprising:
a second calibration circuit coupled between the second terminal of the resistor ladder and a ground terminal.

5. The data processing system of claim 4, wherein the first voltage calibration circuit comprises a plurality of loads selectively coupled in parallel.

6. The data processing system of claim 5, wherein the second calibration circuit comprises a plurality of loads selectively coupled in series.

7. The data processing system of claim 1, wherein the first feature is the variable frequency and the variable frequency is greater than a frequency of the system clock.

8. The data processing system of claim 5, further comprising a second feature, wherein the second feature comprises the variable phase.

9. The data system of claim 1, wherein the plurality of amplifiers comprises a first amplifier, wherein the first amplifier comprises:
an N channel transistor having a gate coupled to a first output of the plurality of outputs, a source coupled to a ground terminal, and a drain; and
a P channel transistor having a gate coupled to the first output of the plurality of outputs, a source connected to the power supply network, and a drain coupled to the drain of the N channel transistor.

10. The data system of claim 1, wherein the variable clock generator is responsive to the system clock.

11. A data processing system on an integrated circuit, comprising:
a core, coupled to a first power supply network, that performs switching operations responsive to a system clock that cause an IR-drop from the first power supply network; and
an IR-drop detector, comprising:
a first voltage calibration circuit having a first terminal coupled to the first power supply network and a second terminal; and
a resistor ladder having a first terminal coupled to the second terminal of the first voltage calibration circuit and a second terminal, wherein the resistor ladder has a plurality of outputs between the first terminal and the second terminal of the resistor ladder;
a first plurality of voltage sensors coupled to the outputs of the resistor ladder;
wherein: the outputs of the resistor ladder are representative of the IR-drop;
each voltage sensor of the plurality of voltage sensors has a first threshold voltage; and
the first voltage calibration circuit is variable to optimize a location of a voltage range of the resistor ladder relative to the first threshold voltage.

12. The data processing system of claim 11, wherein:
each of the plurality of voltage sensors has a first threshold voltage; and
when the IR-drop is increased, fewer inputs of the plurality of sensors exceeds the first threshold voltage.

13. The data processing system of claim 11, further comprising a variable clock generator providing a sampling clock coupled to the plurality of voltage sensors.

14. The data processing system of claim 13, wherein the variable clock generator can vary the frequency and phase of the sampling clock.

15. The data processing system of claim 14, wherein the plurality of voltage sensors can indicate the IR-drop at a plurality of locations within a period of the system clock.

16. A method for operating a data processing system having a core coupled to a first power supply network, comprising:
operating the core to cause an IR-drop at the first power supply network responsive to a first clock having a phase and a frequency;
using a resistor ladder to generate a plurality of outputs representative of the IR-drop;
receiving the plurality of outputs with a plurality of flip-flops clocked with a second clock having a phase and a sampling frequency;
providing an output indicative of the IR-drop from the plurality of flip-flops responsive to the second clock.

17. The method of claim 16, wherein the step of providing the output indicative of the IR-drop is further characterized by the second clock having a different phase from the first clock.

18. The method of claim 16, wherein the providing the output indicative of the IR-drop is further characterized by the second clock having a different frequency from the first clock.

19. The method of claim 18, wherein the providing the output indicative of the IR-drop provides the output indicative of the IR-drop at the frequency of the second clock.

20. The method of claim 16, wherein the first clock has a time period between first edges of the first clock, wherein the step of providing the output indicative of the IR-drop is further characterized by the output indicative of the IR-drop being provided for a selectable time within the time period between the first edges.

* * * * *